(12) United States Patent
Martin et al.

(10) Patent No.: US 7,309,640 B2
(45) Date of Patent: Dec. 18, 2007

(54) METHOD OF FABRICATING AN INTEGRATED CIRCUIT INCLUDING HOLLOW ISOLATING TRENCHES AND CORRESPONDING INTEGRATED CIRCUIT

(75) Inventors: Alexandre Martin, Crolles (FR); Davy Villanueva, Grenoble (FR); Frédéric Salvetti, Gieres (FR)

(73) Assignees: STMicroelectronics SA, Montrouge (FR); Koninklijke Philips Electronics N.V., Eindhoven (NL)

( * ) Notice: Subject to any disclaimer, the term of this patent is extended or adjusted under 35 U.S.C. 154(b) by 364 days.

(21) Appl. No.: 11/110,359

(22) Filed: Apr. 20, 2005

(65) Prior Publication Data
US 2005/0245043 A1    Nov. 3, 2005

(30) Foreign Application Priority Data
Apr. 21, 2004   (FR)   .................................. 04 04222

(51) Int. Cl.
*H01L 21/76*   (2006.01)
(52) U.S. Cl. ............................. 438/427; 257/E21.548
(58) Field of Classification Search ................ 438/424, 438/425, 427; 257/E21.548
See application file for complete search history.

(56) References Cited

U.S. PATENT DOCUMENTS 6,096,656 A * 8/2000 Matzke et al. .............. 438/702

2003/0234423 A1* 12/2003 Bul et al. .................... 257/341
2003/0234433 A1* 12/2003 Tran ............................ 257/506
2006/0131651 A1* 6/2006 Sato et al. ................... 257/347

FOREIGN PATENT DOCUMENTS

| EP | 1 209 738 | 5/2002 |
| WO | WO 03/096426 | 11/2003 |

OTHER PUBLICATIONS

French Preliminary Search Report dated Nov. 3, 2004 for French Application No. 04 04222.

* cited by examiner

*Primary Examiner*—Bradley K Smith
(74) *Attorney, Agent, or Firm*—Lisa K. Jorgenson; Stephen Bongini; Fleit Kain Gibbons Gutman Bongini & Bianco P.L.

(57) ABSTRACT

A method is provided for fabricating an integrated circuit. According to the method, hollow isolating trenches are produced within a substrate, and active components are produced in and on active areas of the substrate that are between the trenches. The trenches are produced in an initial phase carried out before production of the active components and a final phase carried out after production of the active components. In the initial phase, trenches are formed in the substrate, and the trenches are filled with a fill material. In the final phase, the active components are encapsulated, accesses are created through the encapsulation material to each filled trench, the fill material is removed through each access, and the opening of each trench is plugged through the corresponding access. Also provided is an integrated that includes hollow isolating trenches within a substrate.

12 Claims, 13 Drawing Sheets

METHOD OF FABRICATING AN INTEGRATED CIRCUIT INCLUDING HOLLOW ISOLATING TRENCHES AND CORRESPONDING INTEGRATED CIRCUIT

CROSS-REFERENCE TO RELATED APPLICATIONS

This application is based upon and claims priority from prior French Patent Application No. 04 04222, filed Apr. 21, 2004, the entire disclosure of which is herein incorporated by reference.

FIELD OF THE INVENTION

The present invention relates to integrated circuits, and more specifically to integrated circuits including hollow isolating trenches.

BACKGROUND OF THE INVENTION

An integrated circuit generally comprises active components, for example transistors, mutually separated by isolating areas, for example by deep trench isolation (DTI) or shallow trench isolation (STI). Since air is a very good electrical insulator, the isolating trenches are advantageously hollow.

The techniques routinely used to fabricate an integrated circuit including hollow isolating trenches normally include complete production of the hollow isolating trenches before the production of the active devices.

More specifically, according to these known methods, the trench is etched and then its opening is plugged, for example with a conformal coating of an oxide layer. To avoid more or less completely filling the trench in the plugging operation, it is important for the opening of the trench not to be too large. Consequently, only narrow trenches, which present a reduced air volume, can be obtained with these conventional methods.

SUMMARY OF THE INVENTION

In view of these drawbacks, it is an object of the present invention to overcome the above-mentioned drawbacks and to provide an integrated circuit with hollow isolating trenches of the required dimensions, and in particular wide trenches presenting a large volume of air.

Another object of the present invention is to create hollow isolating trenches using a fill material so as to enable the conventional patterns and methods to be used to produce the gate and the associated contacts.

Yet another object of the present invention is to obtain hollow isolating trenches between active devices that offer a reduction in the electrostatic coupling effects through the permittivity of the gases enclosed in the trenches (air or vacuum, for example), in other words, a reduction in the leakages associated with the appearance of parasitic conduction channels along the trenches.

A further object of the present invention is to provide trenches that offer a relaxation of the mechanical strains in the active areas that are induced by the conventional technological steps of trench production.

One embodiment of the present invention provides a method for fabricating an integrated circuit. According to the method, hollow isolating trenches are produced within a substrate, and active components are produced in and on active areas of the substrate that are between the trenches. The trenches are produced in an initial phase carried out before production of the active components and a final phase carried out after production of the active components. In the initial phase, trenches are formed in the substrate, and the trenches are filled with a fill material. In the final phase, the active components are encapsulated, accesses are created through the encapsulation material to each filled trench, the fill material is removed through each access, and the opening of each trench is plugged through the corresponding access.

Another embodiment of the present invention provides an integrated that includes a substrate, hollow isolating trenches within the substrate, and active components in and on active areas of the substrate that are positioned between the hollow isolating trenches. The integrated circuit further includes encapsulation material for encapsulating the active components, an access through the encapsulation material to each of the trenches, and a plugging material filling each of the accesses so as to plug the opening of each of the hollow isolating trenches. In one preferred embodiment, each of the accesses to the trenches is an opening that is narrower than the width of a top of the corresponding trench, and a conformal deposition of the plugging material is present in the openings and trenches.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

A preferred embodiment of the present invention provides a method of fabricating an integrated circuit that includes hollow isolating trenches within a substrate and active components in and on the active areas of the substrate that are positioned between the trenches. The trenches are created in an initial phase and a final phase. The initial phase, which is carried out before the production of the active components, comprises forming the trenches in the substrate, and filling the trenches with a fill material. The final phase, which is carried out after the production of the active components, comprises encapsulating the active components, creating an access to each filled trench through the encapsulation material, removing the fill material through each access, and plugging the opening of each trench through the corresponding access.

By combining the creation of the trenches in two phases with the use of the component encapsulation layer to provide an access to the trench in order to empty it and then to plug its opening, a required form factor can be defined, enabling trenches of any dimensions, in particular wide trenches, to be plugged, while retaining a large volume of air, for example.

The method according to the preferred embodiment of the present invention therefore enables there to be obtained integrated circuits comprising hollow isolating trenches of the required dimension and having enhanced isolating properties.

According to one embodiment of the present invention, the access to the trench is advantageously a well narrower than the top part of the trench, and the plugging of the opening of the trench comprises the conformal deposition of a plugging material in the well.

Preferably, the fill material is a material that can be removed selectively with respect to the material of the substrate and the encapsulation material, and the removal of the fill material comprises, for example, selective etching of the fill material.

In one embodiment of the present invention, the fill material is germanium (Ge) or a silicon-germanium (Si—Ge) alloy.

According to some embodiments of the present invention, at least some of the trenches are shallow trenches. According to some embodiments of the present invention, at least some of the trenches are deep trenches.

The present invention also provides an integrated circuit obtained by such a method.

Exemplary embodiments of the present invention will now be described in detail with reference to FIGS. 1-13.

Figure 1:
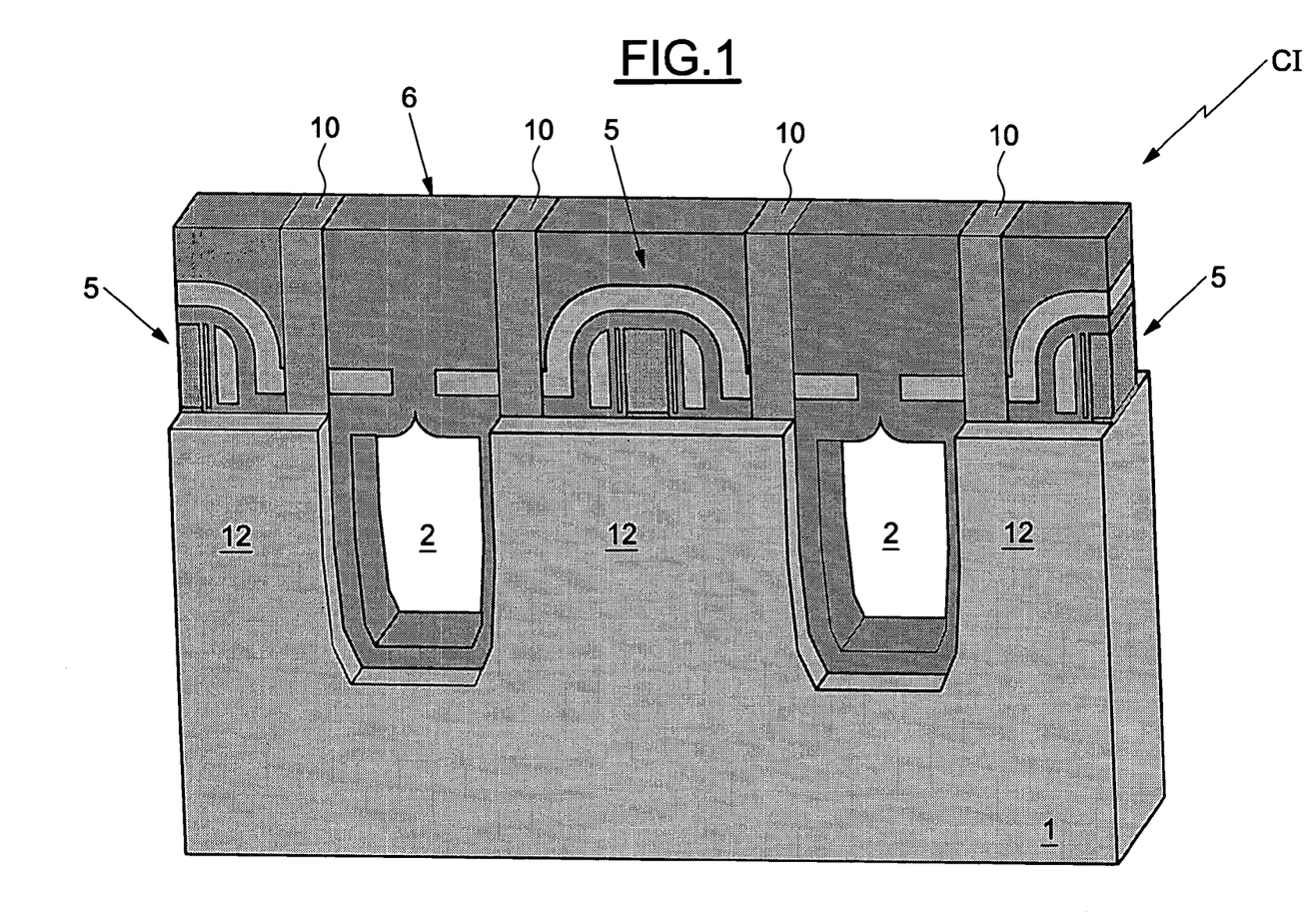
FIGS. 1 and 2 show portions of an integrated circuit according to an embodiment of the present invention.
Figure 2:
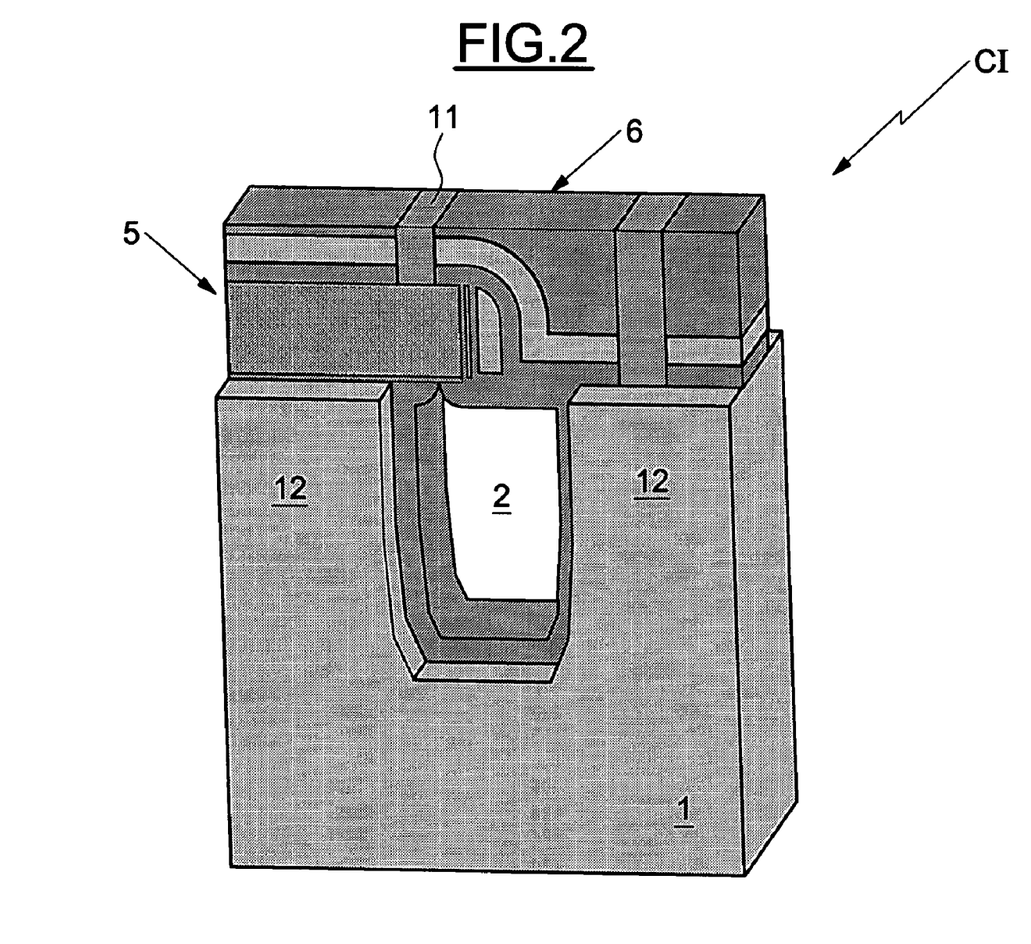

FIGS. 1 and 2 show portions of an integrated circuit according to an embodiment of the present invention. As shown, the integrated circuit CI comprises active components, such as MOS transistors, isolated from each other by hollow isolating trenches. FIGS. 1 and 2 respectively show a lengthwise and widthwise view of the transistors.

The integrated circuit comprises a substrate 1, in which the hollow trenches 2 have been produced between the active areas 12 of the substrate.

The transistors 5 have been implemented in and on the active areas of the substrate. The active devices are encapsulated by an encapsulation layer 6 which also plugs the opening of the trenches.

Drain/source contacts 10 have been produced in the encapsulation layer 6. Similarly, as shown in FIG. 2, a gate contact 11 has been implemented in the encapsulation layer 6.

There now follows a detailed description of the main steps of a method according to a preferred embodiment of the present invention for obtaining the integrated circuit of FIGS. 1 and 2.

FIGS. 3 to 6 illustrate, in the interest of simplicity, a half-trench and a half-transistor, with it being understood that these figures have a vertical axis of symmetry.

Figure 3:
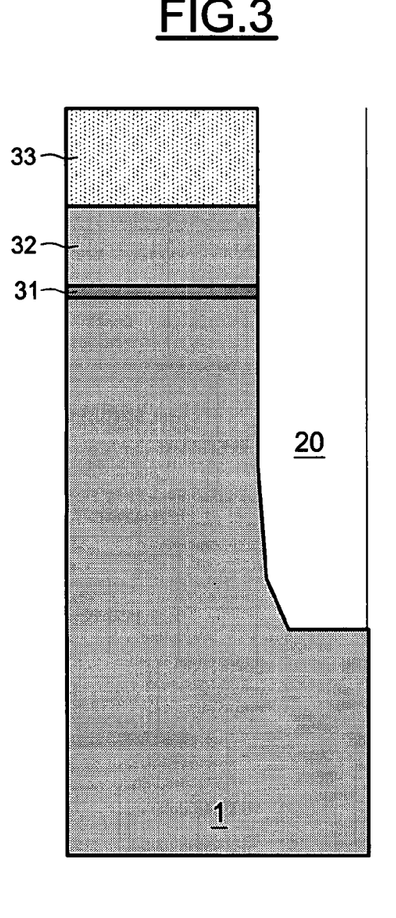
FIGS. 3 to 13 illustrate steps of a method according to a preferred embodiment of the present invention.

As shown in FIG. 3, a layer of silicon oxide $SiO_2$ 31 topped by a layer of silicon nitride $Si_3N_4$ 32 is formed on the substrate 1, typically of silicon. Then, a resist mask 33 is deposited, in which an opening corresponding to the opening of the trench is formed.

Then, in a known manner, the layers 32 and 31 are etched. The trench 20 is then etched, in a known manner, for example by chemical or plasma etching.

In the case of an STI-type trench, the depth of the trench 20 is, for example, approximately 0.3 µm, whereas it is approximately 5 µm for a DTI-type trench.

The trench is then filled (FIG. 4) with a fill material 4. This material is, for example, a material that can be removed selectively with respect to the substrate and the other materials used in fabricating the integrated circuit, such as the encapsulation materials. Examples of selectively removable materials include germanium (Ge) and silicon-germanium alloys (SiGe).

Figure 4:
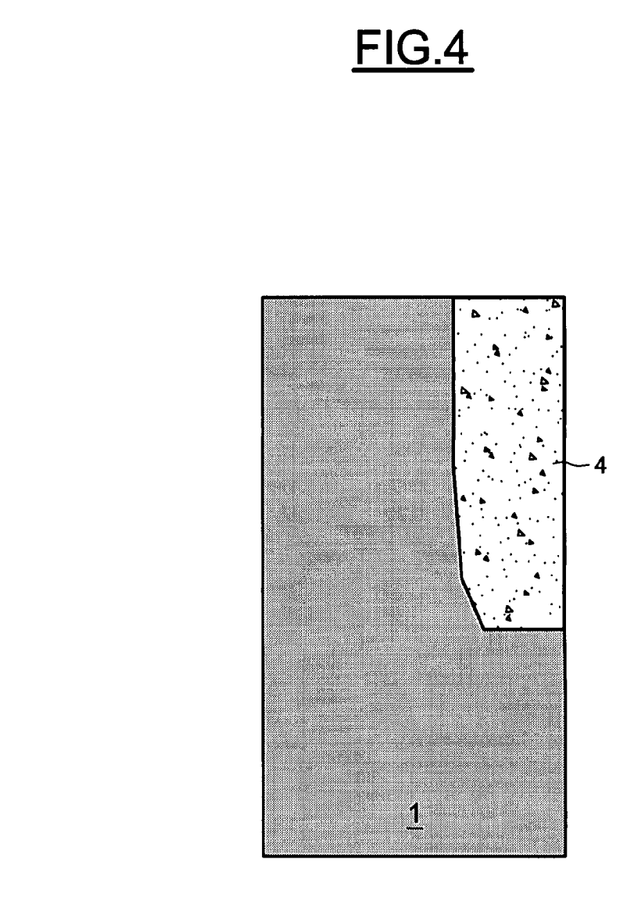

The alloys $Si_{1-x}Ge_x$ in which $0<x<1$ and the alloys $Si_{1-x}Ge_xC_y$ in which $0<x\leq0.95$ and $0<y\leq0.5$ are preferred. Preferably, the SiGe alloys have a relatively high germanium content ($x\geq0.1$; preferably $0.1\leq x\leq0.3$) for a better etch selectivity compared with silicon and $SiO_2$.

In this exemplary embodiment, the fill material fills the trench by deposition, for example material of the TEOS type. In further embodiments, an epitaxy is possible.

Any excess material (SiGe, silicon nitride, etc.) is removed by etching, and the surface of the substrate is, if necessary, subjected to a chemical-mechanical polishing step.

Figure 5:
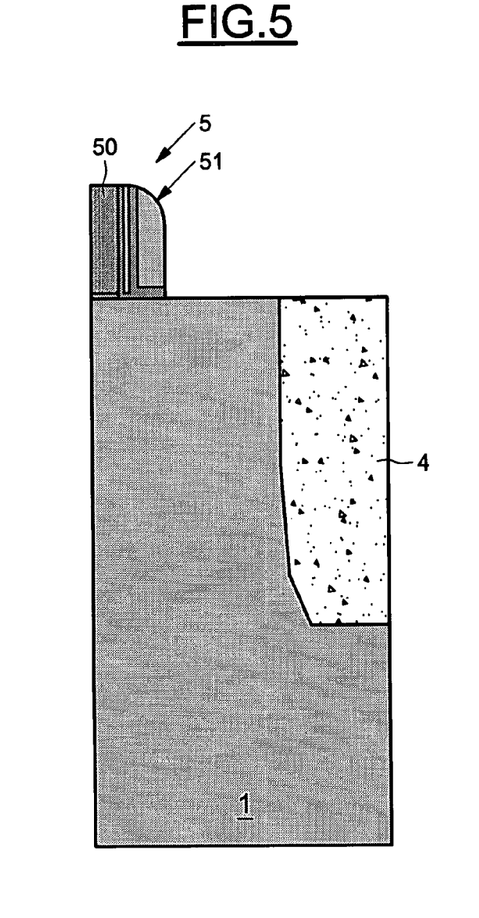

The filling of the trench is followed by the production of the active components 5, as illustrated in FIG. 5, according to conventional fabrication steps.

In FIG. 5, the insulated gate 50 of the transistor 5 is also partially illustrated, and flanked by insulating spacers 51, in this case multilayers ($SiO_2$, $Si_3N_4$).

A transistor encapsulation (FIG. 6) is then performed in a known manner. This encapsulation can be implemented, for example, by depositing a triple layer 6 (e.g., comprising an $SiO_2$ oxide first layer 61, an $Si_3N_4$ nitride second layer 62 and an $SiO_2$ oxide third layer 63). This step is followed by a chemical-mechanical polishing of the surface of the circuit.

Figure 6:
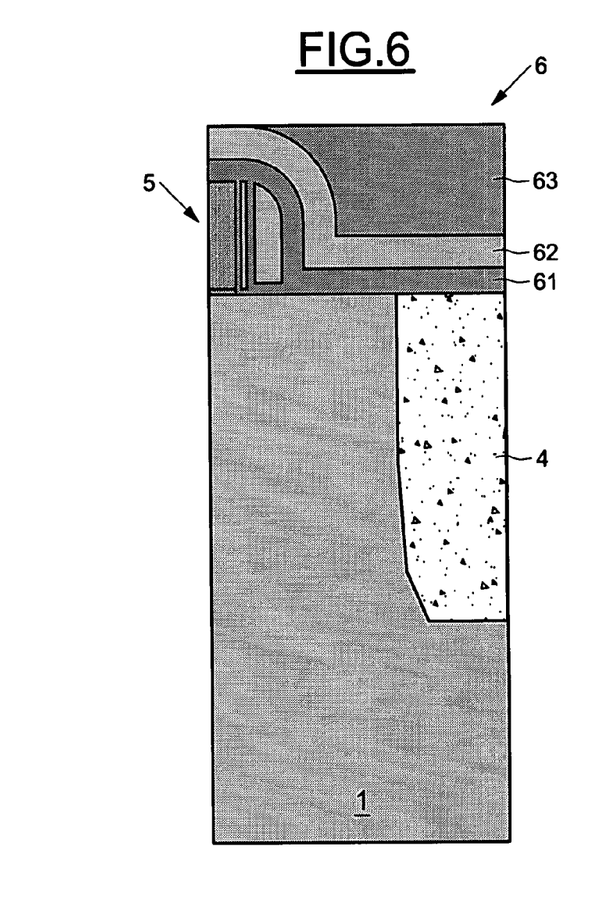

A well 64 is then made in the encapsulation layer 6 in order to access the upper surface of the trench 20 filled with the fill material 4.

Figure 7A:
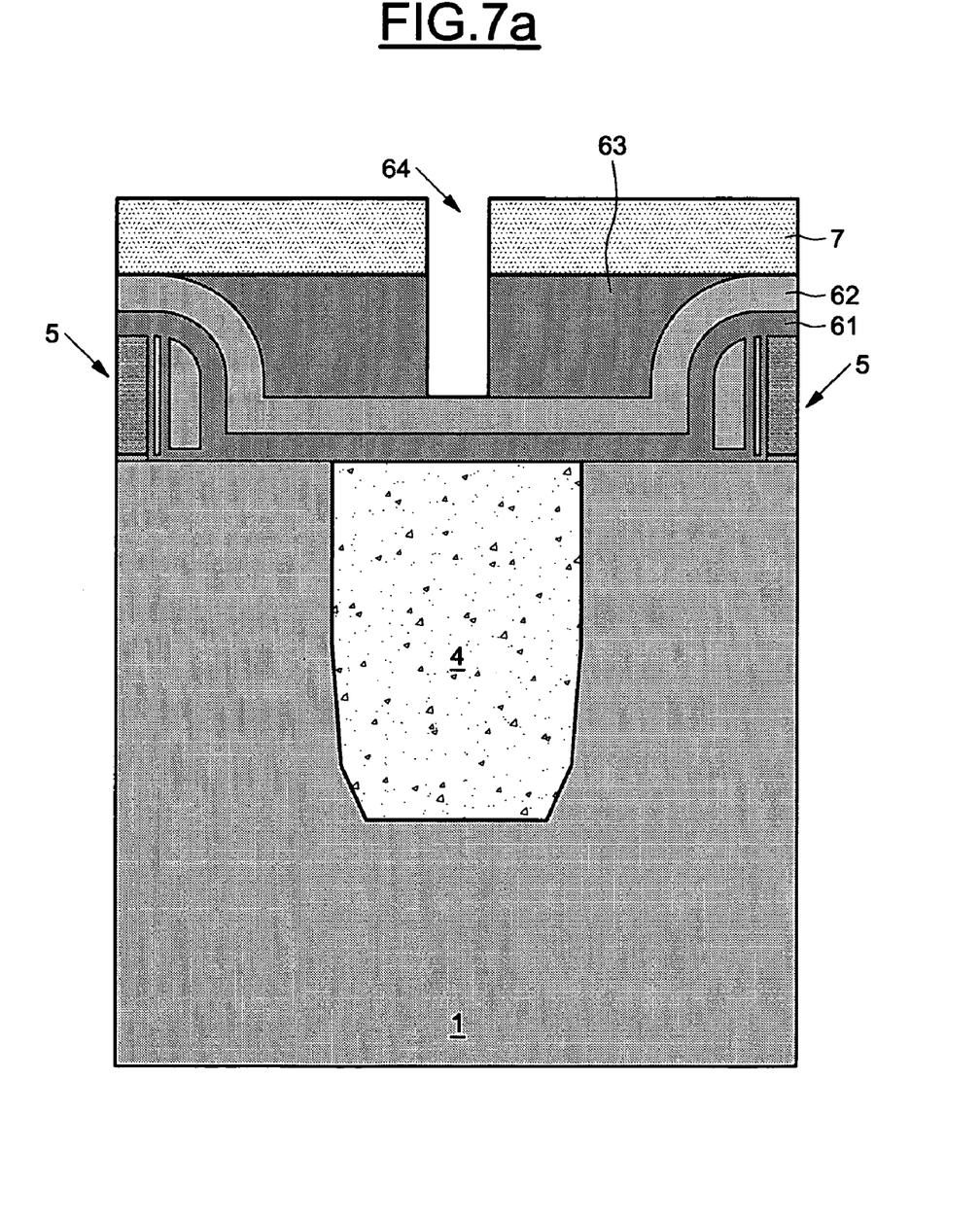

As illustrated in FIG. 7a, this well 64 is etched using a resist mask 7 which is used to define the dimensions of the orifice of the well. The etching is performed by successive known etches, until the fill material 4 is reached.

The proportions of the well are determined according to the thickness of the encapsulation layer and the dimensions of the isolating trench in order to obtain the desired form factor. This well will in general preferably be narrower than the upper part (opening) of the trench, and its height is preferably at least twice its width in order to avoid creating an air bubble in the subsequent filling step.

Figure 7B:
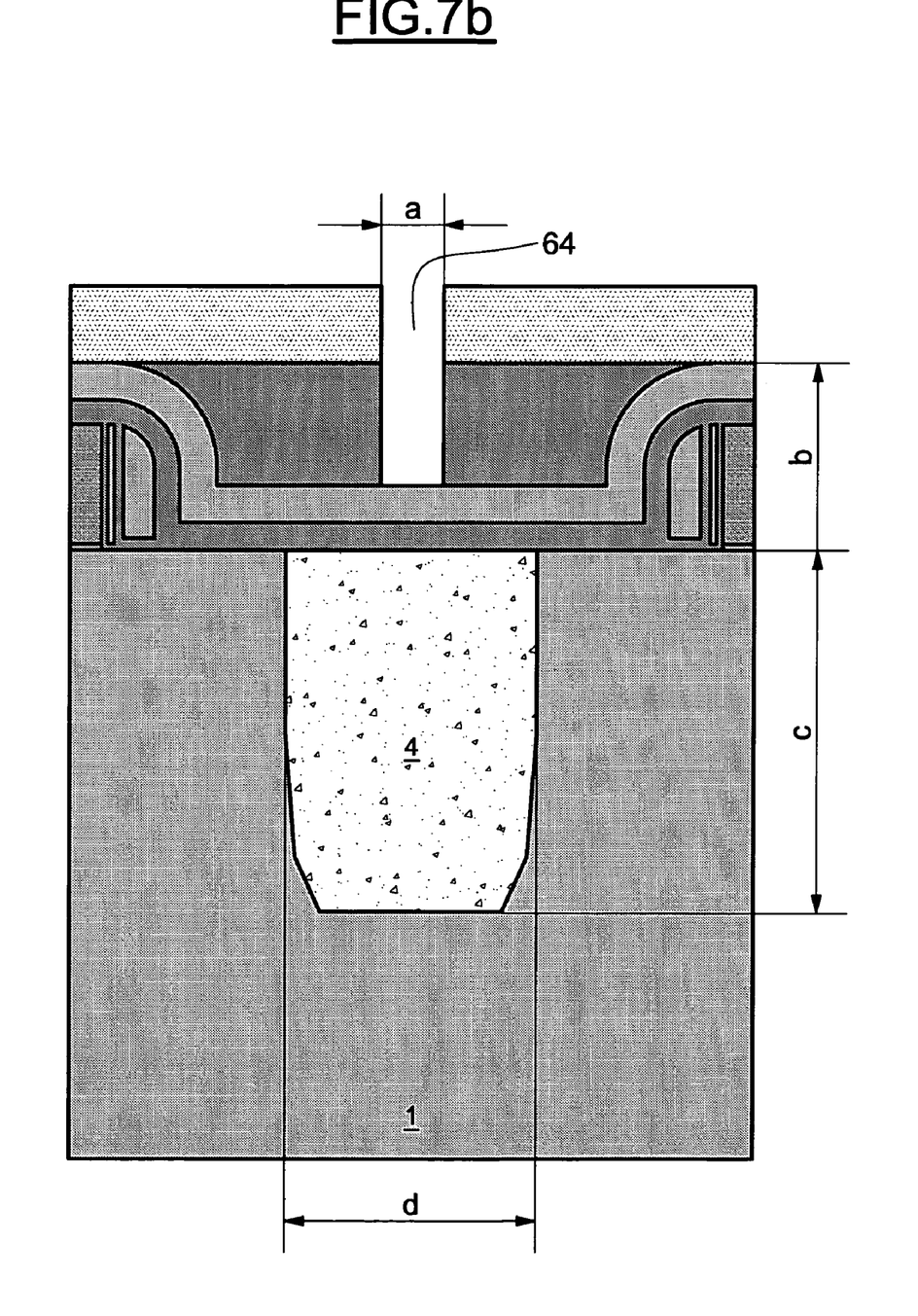

FIG. 7b shows an exemplary shallow trench (STI). The depth c of the trench is 0.30 µm and its width is 0.21 µm. For an encapsulation layer of thickness b equal to 0.20 µm, a well with a width of between 0.10 and 0.15 µm will be chosen, for example.

Figure 7C:
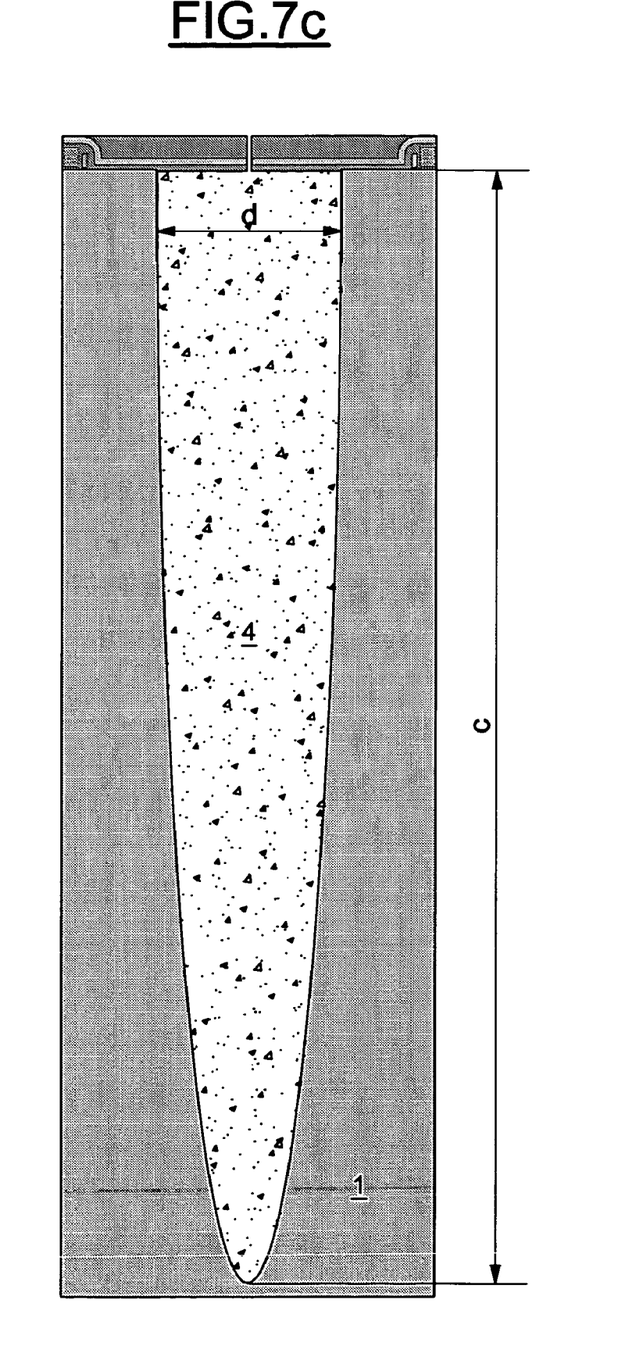

An identical well can then be chosen for the case of an exemplary deep trench (DTI) as illustrated in FIG. 7c, for which d=0.80 µm and c=5 µm.

Once the access well 8 has been made, the fill material 4 is removed (FIG. 8) from the trench through the access well. This removal 8 is performed by selective etching of the fill material 4.

Figure 8:
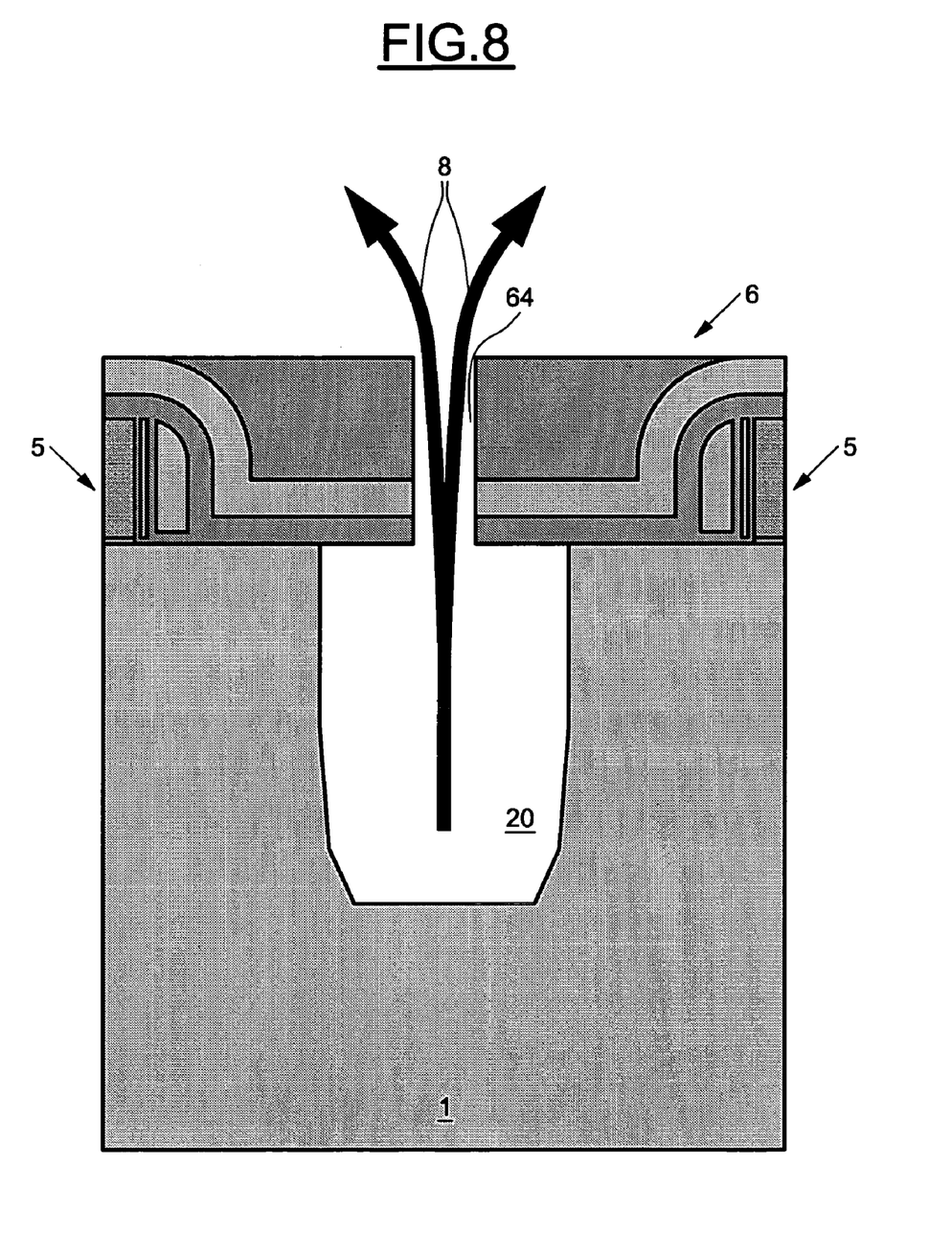

The selective removal of the germanium or the SiGe alloy of this embodiment can be performed by any known method, for example using an oxidizing chemical such as a solution comprising 40 ml of 70% $HNO_3$+20 ml of $H_2O_2$+5 ml of 0.5% HF, or by isotropic plasma etching.

Figure 9:
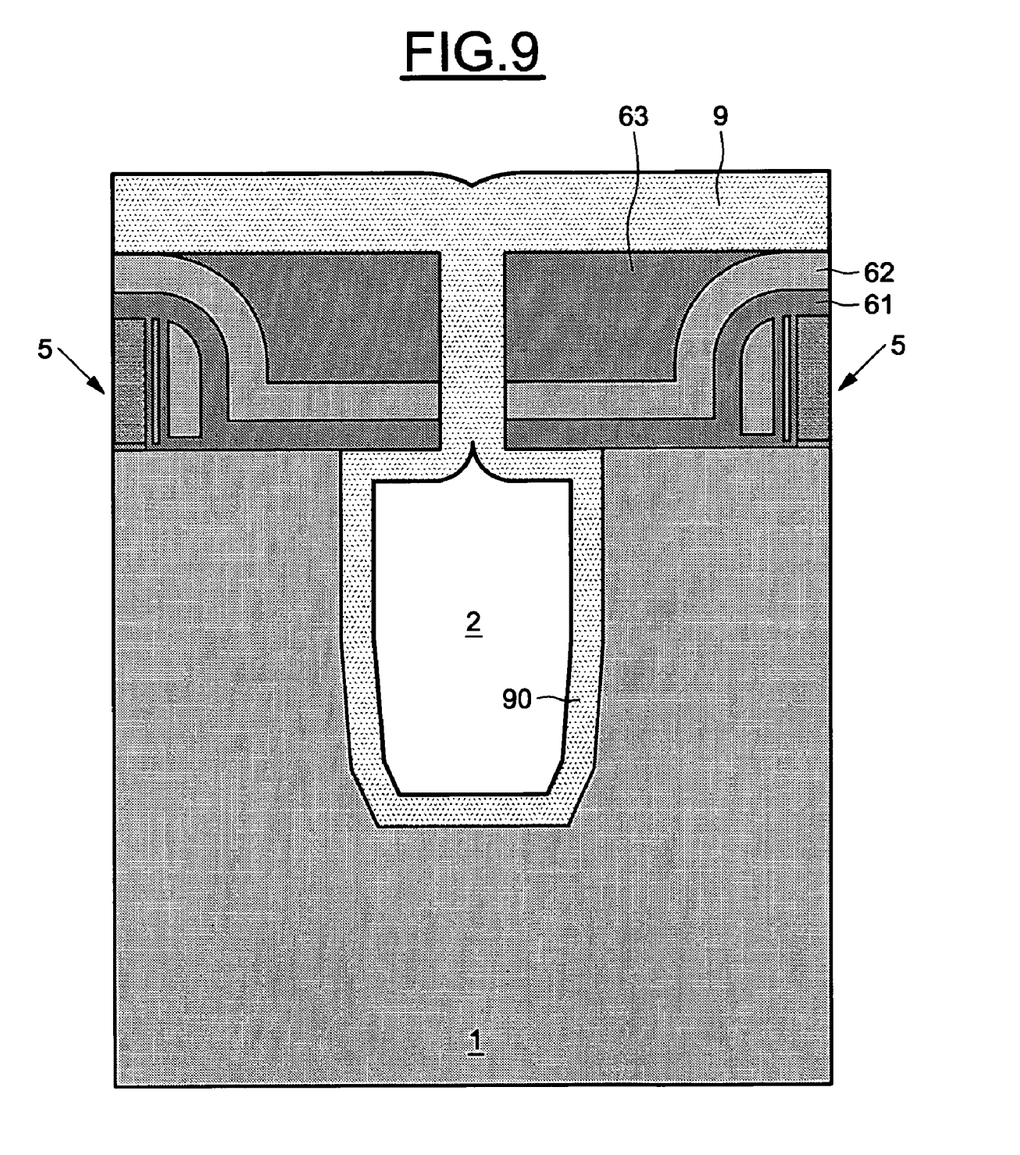
Figure 10:
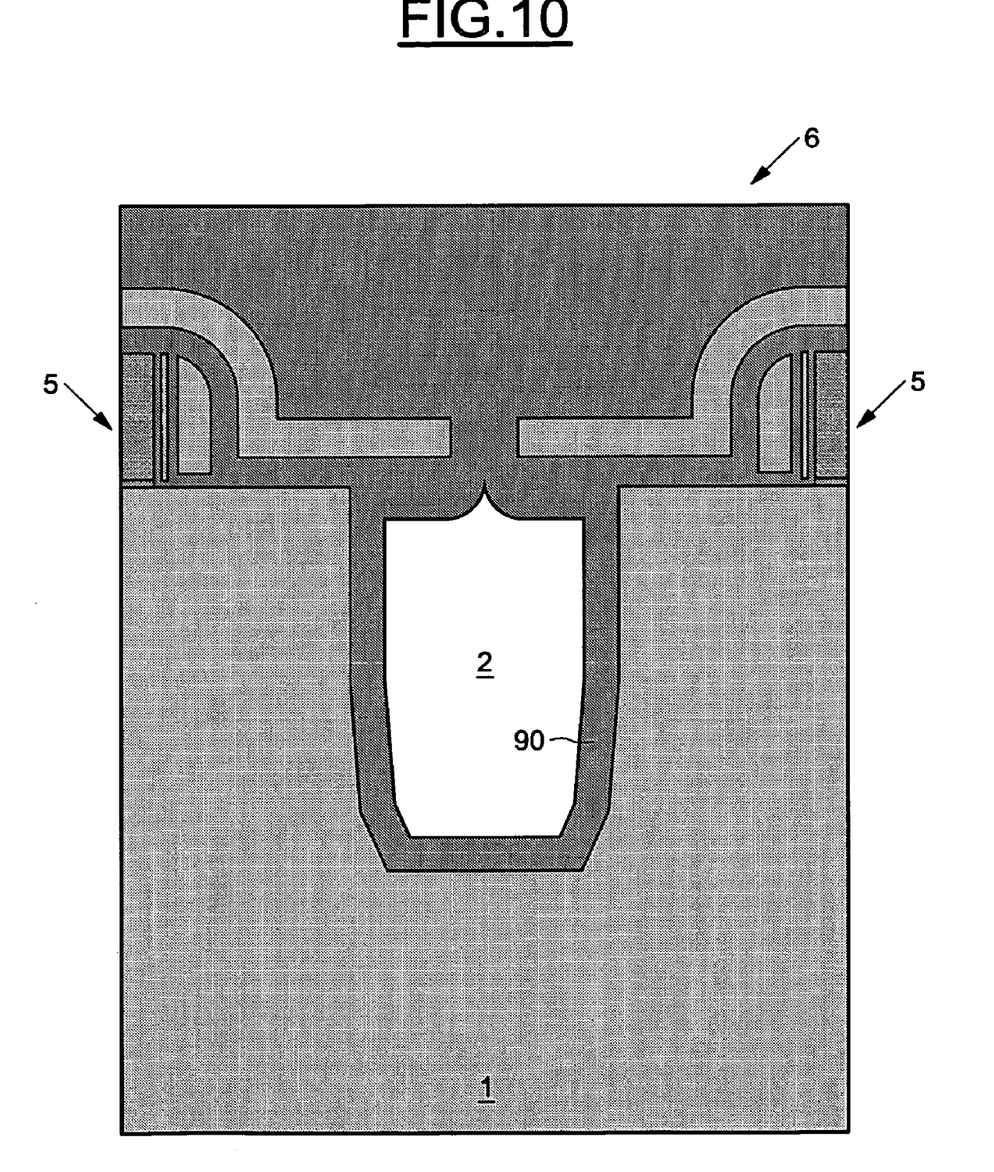

The access well is then plugged (FIG. 9). The plugging can be achieved by a conformal deposition of a plugging material 9 in the well, for example $SiO_2$ like the $SiO_2$ 63 of the encapsulation layer 6. Preferably, the thickness of this conformal coating is approximately half the width of the access well 8. The plugging of the well is followed by a chemical-mechanical polishing step (FIG. 10) carried out on the surface of the circuit.

When the conformal layer is deposited, the well is filled gradually and a layer 90 of plugging material is deposited on the sides of the trench 2. Then, the opening of the trench is plugged as is the well.

Thus, regardless of the size of the trench, it is the access well that defines the opening of the trench to be plugged, and it is through this well that the opening of the trench can be plugged without depositing too much material inside the trench, and thus a sufficient volume of air can be preserved, regardless of the size of the trench.

In further embodiments, the dimensions of the well are chosen according to those of the trench and the encapsulation layer in order to obtain the required result.

In the first phase, the trench fill material 4 serves as a support for the encapsulation layer deposit, and the encapsulation layer then retains its consistency in the well etching stage. Also, the well is used both to remove the fill material in order to restore the hollow trench and then to close off the hollow trench.

Figure 11:
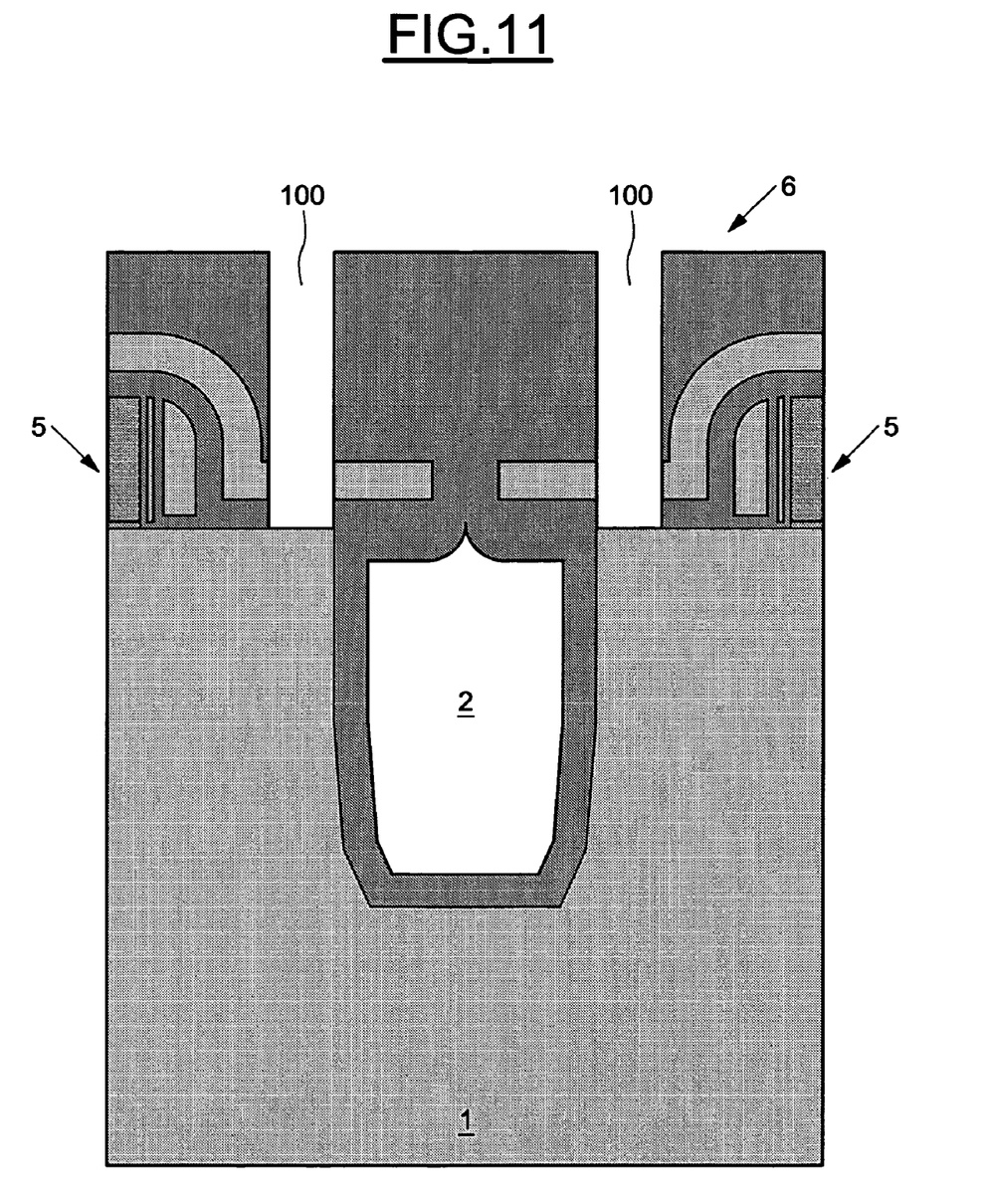
Figure 12:
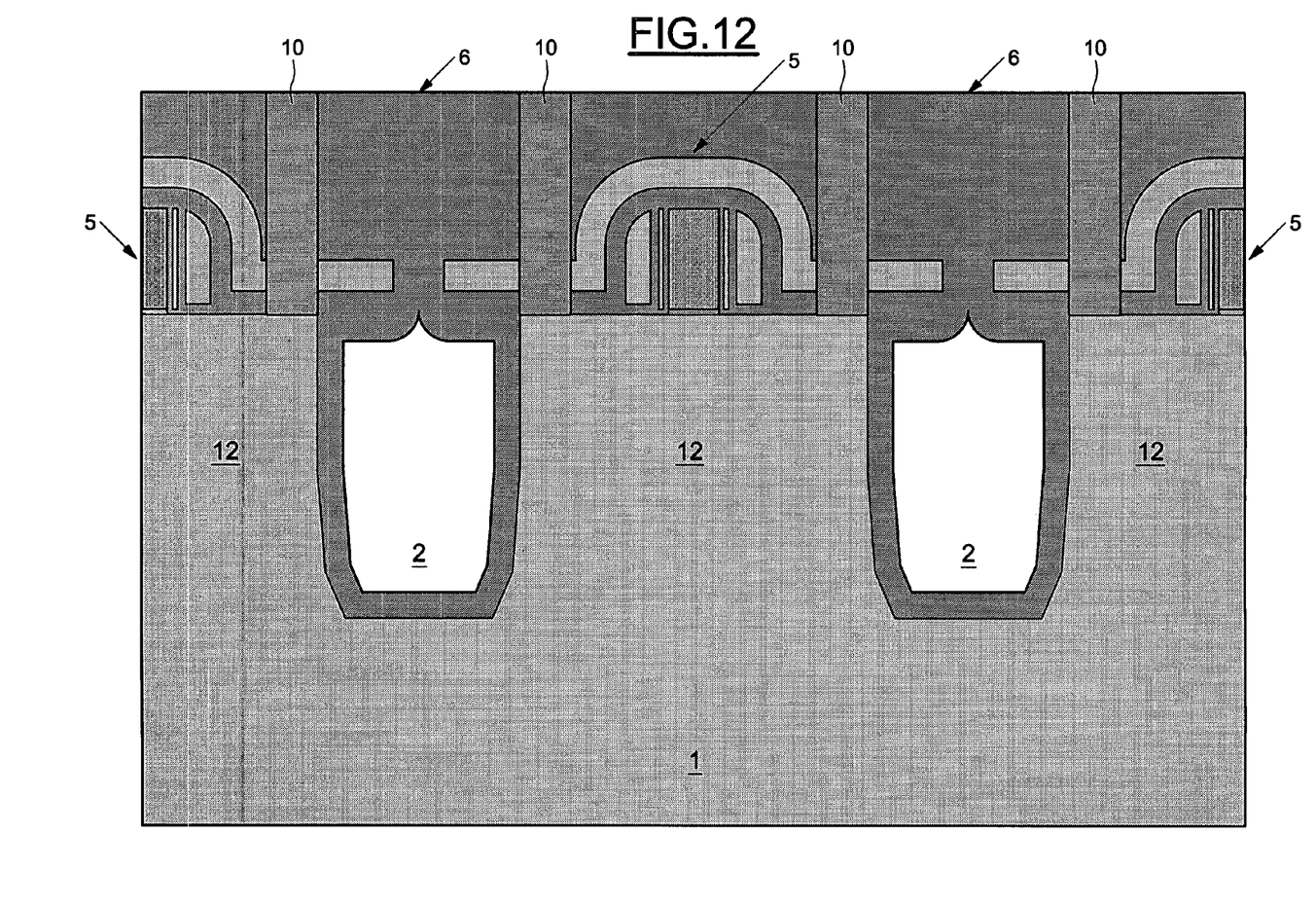

FIG. 11 shows a lengthwise view of the circuit on which the positions 100 of the drain/source contacts have been etched in the encapsulation layer. These positions are then filled with a metal in order to form the drain/source contacts 10 (FIG. 12).

Figure 13:
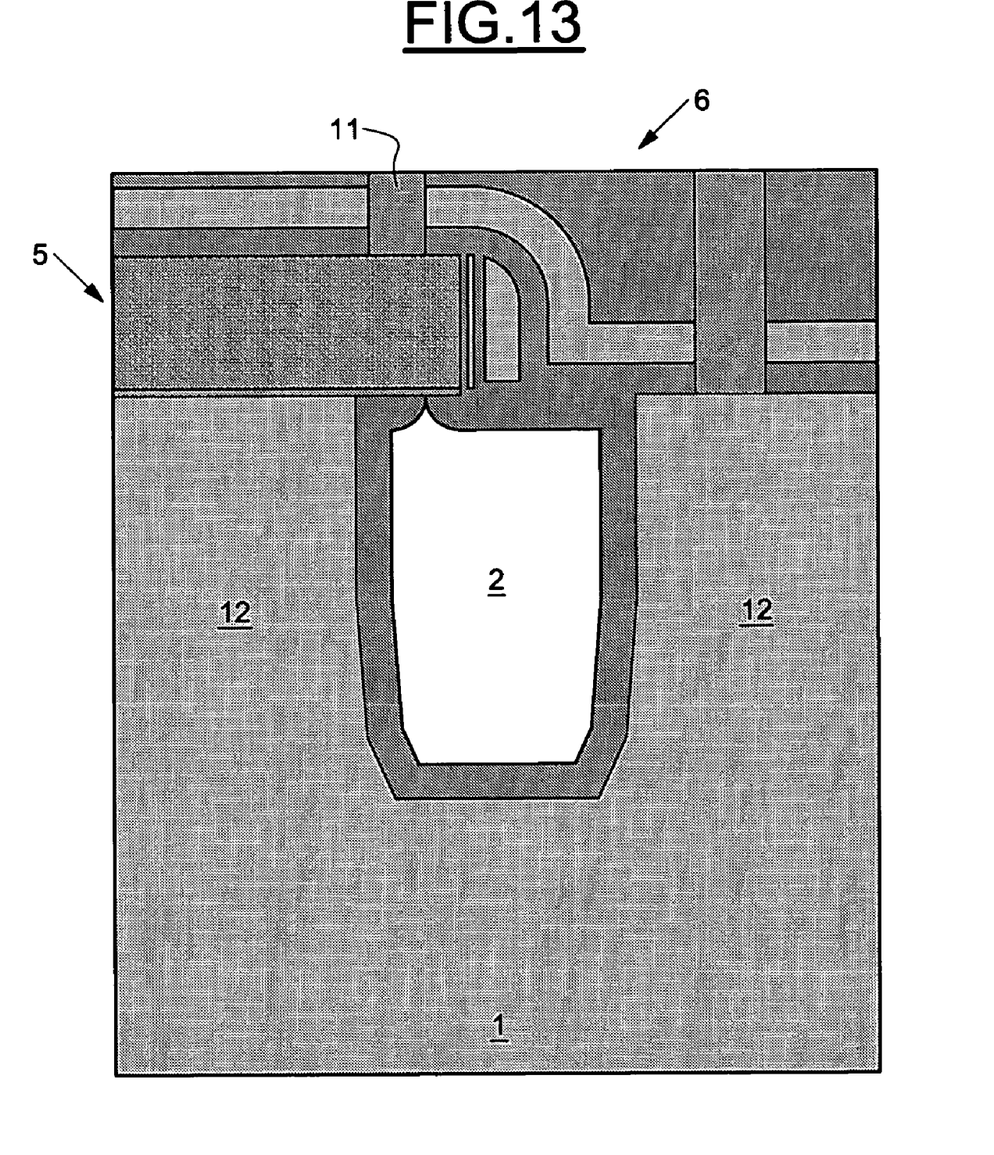

Similarly, FIG. 13 shows a widthwise view of the circuit on which gate contacts 11 have been etched or photo-etched and then filled with a metal.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of fabricating an integrated circuit, said method comprising the steps of:
    producing hollow isolating trenches within a substrate; and
    producing active components in and on active areas of the substrate that are positioned between the hollow isolating trenches,
    wherein the step of producing the hollow isolating trenches comprises the sub-steps of:
        before the step of producing the active components, forming trenches in the substrate, and filling the trenches with a fill material; and
        after the step of producing the active components, encapsulating the active components in encapsulation material, creating through the encapsulation material an access to each of the trenches, removing the fill material of each of the trenches through the corresponding access, and plugging the opening of each of the trenches through the corresponding access.

2. The method according to claim 1, wherein each of the accesses to the trenches is a well that is narrower than the width of a top of the corresponding trench.

3. The method according to claim 2, wherein the plugging of the opening of each of the trenches comprises making a conformal deposition of a plugging material in the well.

4. The method according to claim 3, wherein the fill material is a material that can be removed selectively with respect to the material of the substrate and the encapsulation material.

5. The method according to claim 1, wherein the plugging of the opening of each of the trenches comprises making a conformal deposition of a plugging material in the well.

6. The method according to claim 1, wherein the fill material is a material that can be removed selectively with respect to the material of the substrate and the encapsulation material.

7. The method according to claim 6, wherein the removing of the fill material of each of the trenches comprises selective etching of the fill material.

8. The method according to claim 1, wherein the removing of the fill material of each of the trenches comprises selective etching of the fill material.

9. The method according to claim 1, wherein the fill material is germanium or a silicon-germanium alloy.

10. The method according to claim 1, wherein at least some of the trenches are shallow trenches.

11. The method according to claim 10, wherein at least some of the trenches are deep trenches.

12. The method according to claim 1, wherein at least some of the trenches are deep trenches.

* * * * *